United States Patent [19]

Shindoh et al.

[11] Patent Number: 5,299,031
[45] Date of Patent: Mar. 29, 1994

[54] IMAGE SENSOR AND OPTICAL READING UNIT USING THE SAME

[75] Inventors: Yasuyuki Shindoh; Saburo Sasaki, both of Sendai, Japan

[73] Assignees: Ricoh Company Ltd., Tokyo; Ricoh Research Institute of General Electronics Co., Ltd., Natori, both of Japan

[21] Appl. No.: 578,690

[22] Filed: Sep. 7, 1990

[30] Foreign Application Priority Data

Sep. 13, 1989 [JP] Japan .................................. 1-237706

[51] Int. Cl.$^5$ ............................................. H04N 1/40
[52] U.S. Cl. ..................................... 358/482; 358/483; 348/241
[58] Field of Search ........... 358/482, 483, 463, 213.15; 250/208.1

[56] References Cited

U.S. PATENT DOCUMENTS

| | | | |
|---|---|---|---|
| 4,511,804 | 4/1985 | Ozawa | 358/482 |
| 4,540,901 | 9/1985 | Suzuki | 358/483 |
| 4,679,088 | 7/1987 | Chiyoma et al. | 358/483 |
| 5,004,903 | 4/1991 | Kitamura et al. | 250/208.1 |

*Primary Examiner*—Edward L. Coles, Sr.
*Assistant Examiner*—Thomas H. Stoll
*Attorney, Agent, or Firm*—Oblon, Spivak, McClelland, Maier & Neustadt

[57] ABSTRACT

An image sensor includes a substrate made of an insulating and transparent material, a plurality of photoelectric conversion elements which are provided on the substrate and arranged in a predetermined direction of the substrate, a driving circuit, which is provided on the substrate and extends parallel to the photoelectric conversion elements, for driving the photoelectric conversion elements, and a conductive film adjacent to at least one of the photoelectric conversion elements and the driving circuit, for receiving an external noise signal.

24 Claims, 8 Drawing Sheets

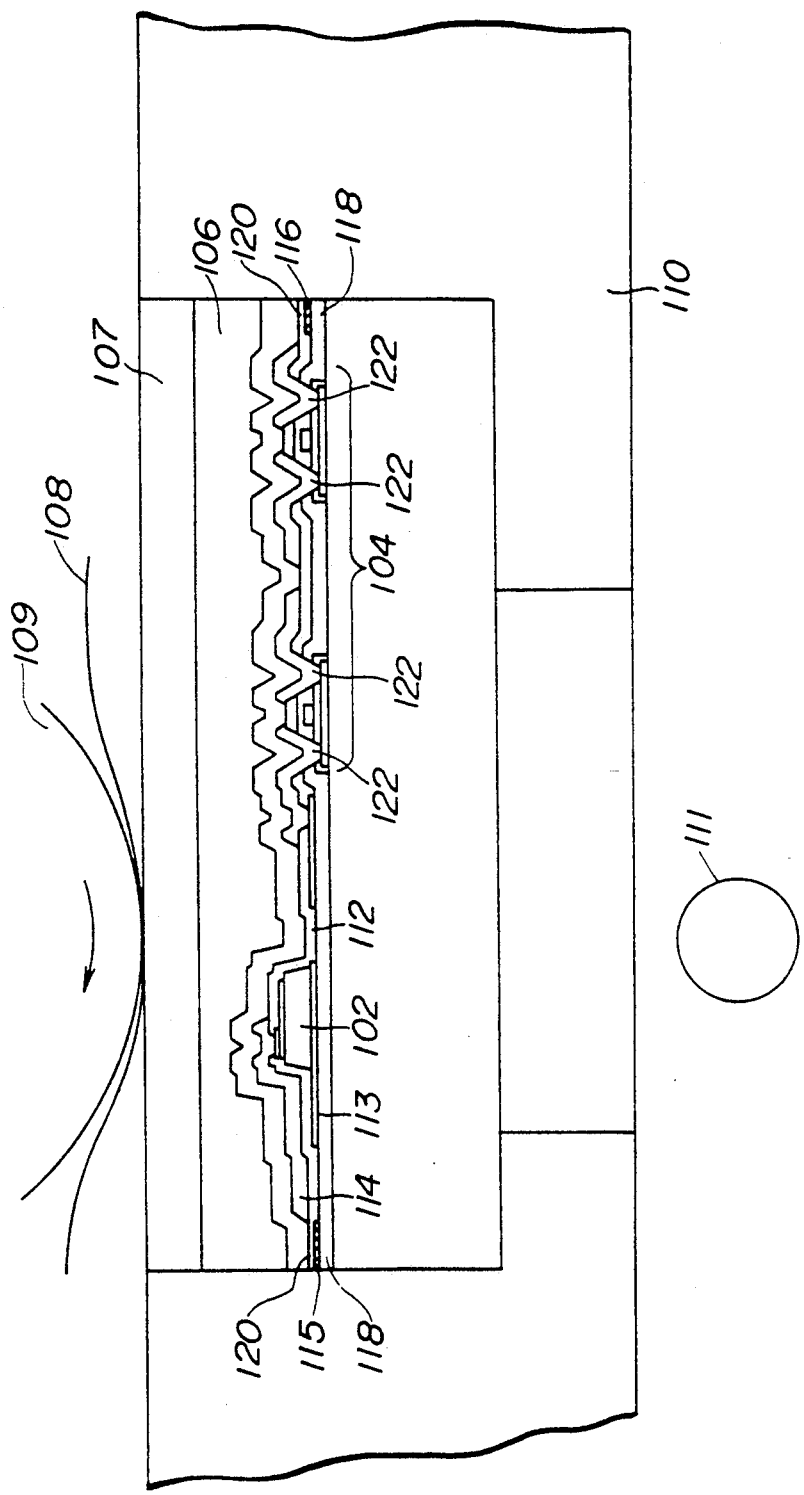

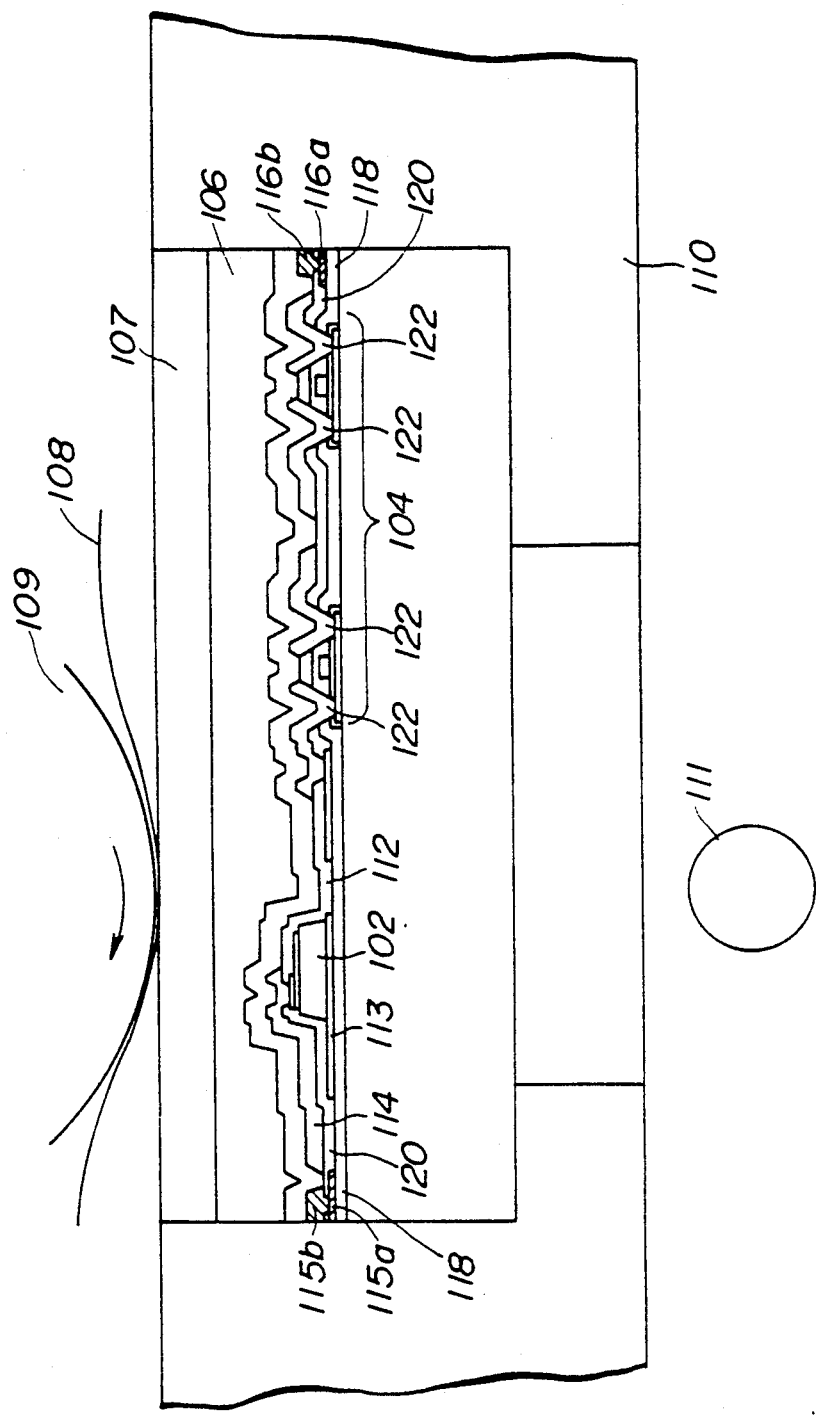

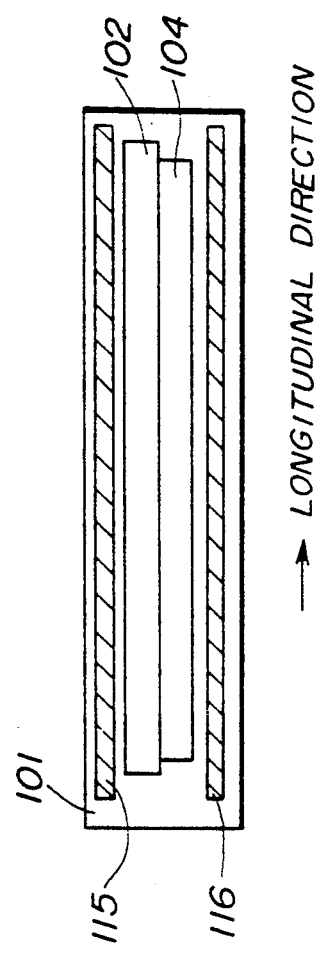

FIG.8

| | FILM FORMING PROCESS | THICKNESS (Å) | GAS | FLOW | BASE TEMP(°C) | PRESSURE (Torr) |
|---|---|---|---|---|---|---|
| ACTIVE LAYER | LP-CVD | 1100 | SiH₄ | 200 SCCM | 630 | 0.1 |
| GATE OXIDE | DRY HEAT OXIDE | 900 | O₂ | 9.7 SLM | 1100 | |
| GATE ELECTRODE | LP-CVD | 3000 | SiH₄ | 200 SCCM | 630 | 0.1 |
| LAYER INSULATING FILM 118 | LP-CVD | 3000 | SiH₄ O₂ | 80 SCCM 40 SCCM | 430 | 0.2 |

| | IMPURITY | ENERGY | DOSE | CURRENT |
|---|---|---|---|---|
| P-CHANNEL | ⟨B⁺⟩ | 30 kev | 2×10¹⁵/cm² | 1.2 mA |
| N-CHANNEL | ⟨P⁺⟩ | 90 kev | 4×10¹⁵/cm² | 1.2 mA |

FIG. 9

| | MATERIAL | FILM FORMING PROCESS | THICKNESS | GAS | FLOW SCCM | PRESSURE Torr | BASE TEMP | POWER W |
|---|---|---|---|---|---|---|---|---|
| LOWER ELECTRODE END SHADED | Cr | VACUUM DEPOSITION PROCESS | 1000 Å | — | — | $2 \times 10^{-5}$ | R.T. | — |
| PHOTO ELECTRIC CONVERSION LAYER | a-Si:H | P-CVD | 1.75 μm | $SiH_4/H_2$ 20% | 100 | 1.0 | 250°C | 20 |
| PHOTO ELECTRIC CONVERSION LAYER | a-Si:O:H | P-CVD | 300 Å | $SiH_4/H_2$ 20%<br>$CO_2$ 100% | 100<br>80 | 1.0 | 250°C | 8 |
| PHOTO ELECTRIC CONVERSION LAYER | P$^+$a-Si:O:H | P-CVD | 350 Å | $SiH_4/H_2$ 20%<br>$CO_2$ 100%<br>$B_2H_6/H_2$ 2000 ppm | 80<br>110<br>76 | 1.0 | 250°C | 8 |
| TRANSPARENT CONDUCTIVE FILM | ITO | RF-SPATTERING | 750 Å | $O_2$ 100%<br>Ar 100% | 1.8<br>60 | $10^{-2}$ | 250°C | 200 |
| PROTECTION LAYER | a-Si:O:N | P-CVD | 1 μm | $SiH_4$ 100%<br>$N_2$ 100%<br>$CO_2$ 100% | 10<br>150<br>50 | 1.0 | 250°C | 100 |
| UPPER ELECTRODE | Aℓ | VACUUM DEPOSITION PROCESS | 1 μm | — | — | $2 \times 10^{-5}$ | 80°C | — |

IMAGE SENSOR AND OPTICAL READING UNIT USING THE SAME

BACKGROUND OF THE INVENTION

Field of the Invention

The present invention generally relates to an image sensor and an optical reading unit using the same, and more particularly to an image sensor and an optical reading unit using the same which can be applied to a facsimile machine, a digital copy machine and so on.

Discussion of the Invention

Recently, in an image processing apparatus such as a facsimile machine, in order to miniaturize the apparatus, a miniaturized optical reading mechanism has been developed. The optical reading mechanism having, for example, a contact type image sensor has been proposed. In this optical reading mechanism, an optical system which is provided between a detected object such as a document sheet and the image sensor is simplified so that the optical reading mechanism having the contact type image sensor is miniaturized. In addition, an optical reading mechanism having a perfect contact type image sensor (a full size image sensor) has also been proposed. In this optical reading mechanism, the perfect contact type image sensor is directly in contact with the detected object, and then the image sensor reads an image which has the same size as the image formed on the detected object (the document sheet).

When the optical reading mechanism is miniaturized, a document sheet, a light source irradiating the document sheet, a motor to feed the document sheet and so on are provided adjacent to the image sensor. A noise is generated when the light source is turned on, the motor generates a noise and an electrostatic noise is generated by the friction which occurs during the feeding of the document sheet. Thus, it is easy for these noises to enter photoelectric conversion portions and a driving circuit portion for driving the photoelectric conversion portions, which are respectively formed on the image sensor. Then, due to the increasing of the noises along with the miniaturizing of the optical reading mechanism as has been described above, the signal-to-noise ratio of the image sensor decreases.

In order to prevent the signal-to-noise ratio of the image sensor from decreasing, the following systems have recently been proposed.

For example, a system in which a conductive member protects the area surrounding the light source has been proposed. In this system, it is possible to eliminate the noise from the optical source, however, the elecrtostatic noise which is generated by the friction which occurs during the feeding of the document sheet and the noise which is generated by the motor for rotating a platen roller continues to enter the image sensor. In addition, the light source is surrounded with the conductive member so that the quantity of the light irradiating the document sheet decreases. Thus, it is difficult to increase the signal-to-noise ratio of the image sensor. Furthermore, there is a disadvantage in that the ambient temperature of the light source increases.

Another system in which a conductive member connected to the ground is provided between the photoelectric conversion elements and the detected object (the document sheet) has been proposed. In this system, it is possible to decrease a noise which is transmitted from the direction of the detected object. However, it is impossible to decrease noises which are transmitted from the direction of the light source and other directions. The conductive member is provided between the photoelectric conversion elements and the document sheet so that the light reflected by the document sheet is prevented from being incident to the photoelectric conversion element. Thus, a new problem, that is the level of the signal from each of the photoelectric conversion elements decreases, occurs. In addition, a stray capacitance is generated between the conductive member and an electrode of each of the photoelectric conversion elements so that the transmitting speed of the signal from each of the photoelectric conversion elements decreases, and so the total reading time by the optical reading mechanism decreases. As regards the making of the image sensor, furthermore, it is necessary to provide a new process for forming the conductive member so that the yield of the image sensor decreases. Also, the conductive member and the electrode of each of the photoelectric conversion elements are isolated by an insulating layer from each other. Then, if there is a pin hole in the insulating layer, the conductive member and the electrode of each of the photoelectric conversion elements are electrically shorted through the pin hole.

SUMMARY OF THE INVENTION

Accordingly, a general object of the present invention is to provide a novel and useful image sensor in which the disadvantages of the aforementioned prior art are eliminated.

A more specific object of the present invention is to provide an image sensor and an optical reading unit in which it is possible to eliminate the influence of an external noise thereon.

The above objects of the present invention are achieved by an image sensor comprising a substrate made of an insulating and transparent material, a plurality of photoelectric conversion elements which are provided on the substrate and arranged in a predetermined direction of the substrate, each of the photoelectric conversion elements having a photoelectric member, a first electrode and a second electrode, the photoelectric member being sandwiched between the first electrode and the second electrode, a driving circuit, which is provided on the substrate and extended parallel to the photoelectric conversion elements, for driving the photoelectric conversion elements, and a conductive member adjacent to at least one of the photoelectric conversion elements and the driving circuit, for receiving an external noise signal.

Furthermore, the above objects of the present invention are achieved by an optical reading unit comprising an image sensor having a substrate made of an insulating and transparent material, a plurality of photoelectric conversion elements which are provided on said substrate and arranged in a predetermined direction of said substrate, each of said photoelectric conversion elements having a photoelectric member, a first electrode and a second electrode, said photoelectric member being sandwiched between said first electrode and said second electrode, a driving circuit, which is provided on said substrate and extends parallel to said photoelectric conversion elements, for driving said photoelectric conversion elements, and a conductive member, adjacent to at least one of said photoelectric conversion elements and said driving circuit, for receiving an external noise, noise eliminating means, coupled to each of said photoelectric conversion elements and said conductive member of said image sensor, for inputting a first signal from each of said photoelectric conversion elements and a second signal from said conductive member, and for outputting a signal which is obtained by eliminating a noise component corresponding to said second signal from said first signal, and signal generating means, coupled to said noise eliminating means, for generating an image signal on the basis of said signal output from said noise eliminating means.

Additional objects, features and advantages of the present invention will become apparent from the following detailed description when read in conjunction with the accompanying drawings.

BRIEF DESCRIPTION OF THE DRAWINGS

FIG. 5 is a cross sectional view showing a second embodiment of the present invention;

FIG. 6 is a cross sectional view showing a third embodiment of the present invention;

FIG. 7 is a plan view showing a example of the image sensor according to the present invention;

FIG. 8 is a view showing conditions for forming each of the layers in a TFT driving circuit and conditions for forming the source and the drain of the TFT;

FIG. 9 is a view showing conditions for forming each of the layers in a photoelectric conversion element.

DESCRIPTION OF THE PREFERRED EMBODIMENTS

A description will now be given of a first embodiment of the present invention with reference to FIG. 1.

Figure 1:
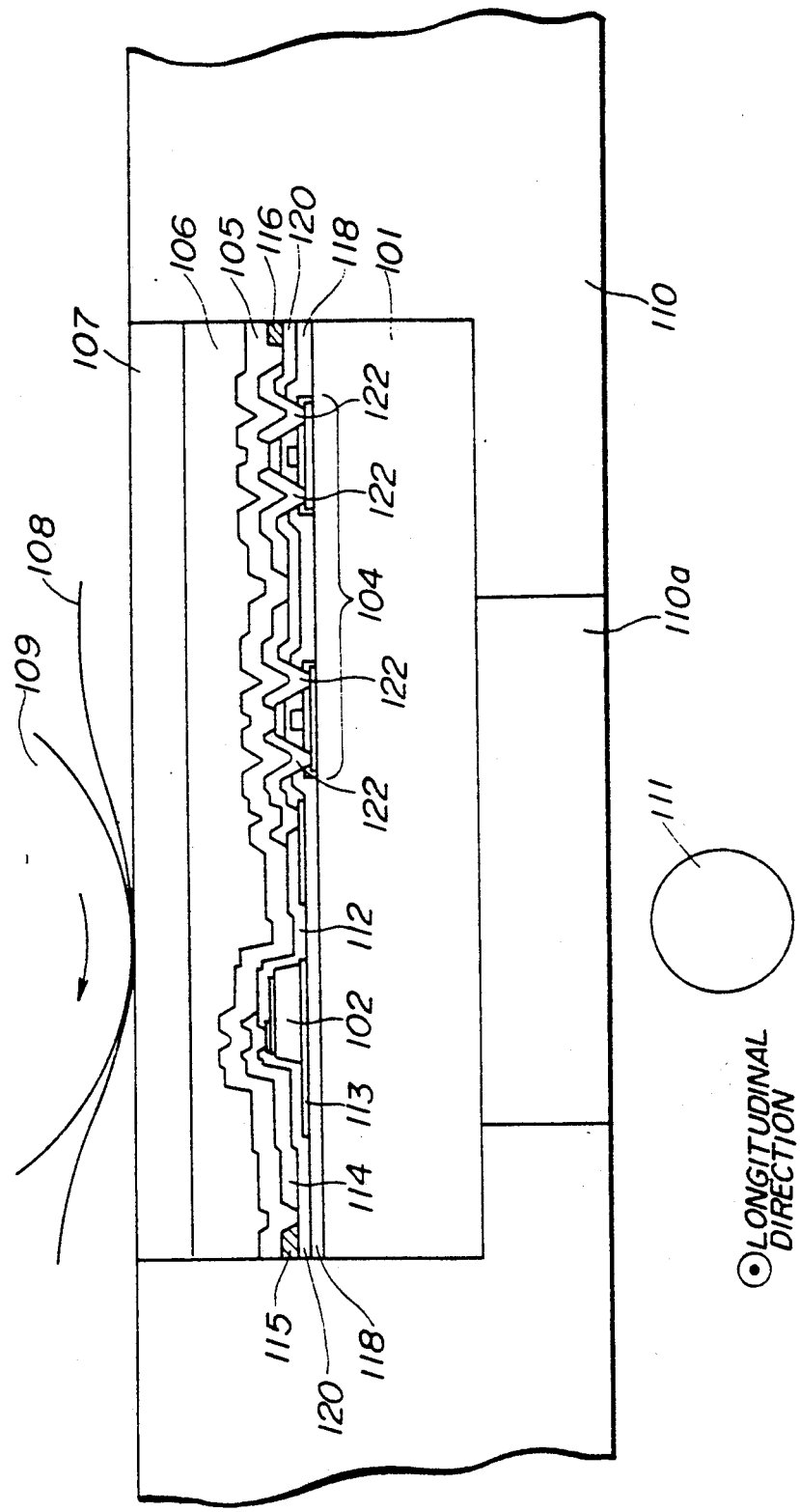
FIG. 1 is a cross sectional view showing a first embodiment of the present invention.

Referring to FIG. 1 which is a cross sectional view of an image sensor, the image sensor is supported by a base member 110 formed of aluminum. A document sheet 108 is sandwiched between a platen roller 109 and the image sensor. The surface of the image sensor is directly in contact with the document sheet 108. That is, the image sensor is structured as a perfect contact type image sensor. A light emitted from a light source 111 passes through a window 110a of the base member 110, and the light is projected onto the rear surface of the image sensor.

The image sensor has a substrate 101 which is formed of quartz. The width of the substrate 101, which is a length in a direction parallel to the sheet of FIG. 1 is, for example, equal to 3 mm . The length in a longitudinal direction of the substrate 101 which is a direction perpendicular to the sheet of FIG. 1 is, for example, equal to 250 mm . It is possible for the substrate 101 to be formed of an arbitrary transparent material, and the size of the substrate 101 is not limited. A plurality of photoelectric conversion elements 102 are provided on the substrate 101. The photoelectric conversion elements 102 are arranged in the longitudinal direction of the substrate 101. The area where the photoelectric conversion elements 102 are arranged corresponds to a width of the document sheet 108 which is, for example, an A4 size sheet. Thus, the number of the photoelectric conversion elements 102 is, for example, equal to 1,728, and a reading density of the image sensor, which corresponds to the number of the photoelectric elements 102 arranged in 1 mm is, for example, equal to 8 dots per 1 mm (8 dpm). A TFT driving circuit 104 which drives the photoelectric conversion elements 102 is formed on the substrate 101 parallel to the photoelectric conversion elements 102. In each of the photoelectric conversion elements 102, an upper electrode 114 and a lower electrode 113 are respectively provided. The image sensor has shield antenna patterns 115 and 116 which are respectively formed of a conductive material such as aluminum (Al). The shield antenna patterns 115 and 116 are formed along sides of the image sensor in the longitudinal direction thereof, and the photoelectric conversion elements 102 and the TFT driving circuit 104 are sandwiched between the shield antenna patterns 115 and 116. The width of each of the shield antenna patterns 115 and 116 is, for example, equal to 100 $\mu$m. The width of each of the shield antenna patterns 115 and 116 can be arbitrarily determined. The image sensor also has a protection layer 105 formed on the photoelectric conversion elements 102 and the TFT driving circuit 104 and a thin glass plate 107 adhered to the protection layer 105 by an adhesive 106.

A description will now be given of a procedure for the forming of the image sensor shown in FIG. 1.

First, the TFT circuit 104 is formed on the substrate 101 which has a size of 50×250 mm. The TFT circuit 104 has a plurality of layers. Each of the layers of the TFT circuit 104 is formed by the LP-CVD process which uses an electric furnace having a silica tube. An SiH$_4$ gas is mainly used so that a polycrystal Si film is formed. Conditions for forming each of the layers of the TFT circuit 104 are indicated in FIG. 8. In the case where the TFT circuit 104 is formed, a layer insulating film 118 is formed on the substrate 101 by the LP-CVD process. Each of the layers is shaped by photolithography and dry etching. When the polycrystal Si film is formed by the LP-CVD process, the polycrystal Si film is formed on each of the surfaces of the substrate 101. The polycrystal Si film formed on one surface of the substrate 101, which faces the light source 111, is perfectly eliminated. When the source and the drain of the TFT are respectively in a p-channel, B$^+$ is injected in both the source and the drain by use of ion implantation. When the source and the drain of the TFT are respectively in an n-channel, P$^+$ is injected in them by use of ion implantation. The implantation conditions are also indicated in FIG. 8.

Second, after forming the TFT driving circuit 104, the photoelectric conversion elements 102 are formed. Each of the photoelectric conversion elements 102 also has a plurality of layers. The conditions for forming each of the layers of each of the photoelectric conversion elements 102 is indicated in FIG. 9. The lower electrode 113 has a window 112 for leading the light emitted from the light source 111 to the surface of the document sheet 108. The lower electrode 113 is formed of Cr on the layer insulating film 118. The thickness of the lower electrode 113 is, for example, equal to 1000 Å. An optical density (OD) of the lower electrode 113 is, for example, equal to 3 (OD=3). Each of the photoelectric conversion elements 102 has a photoelectric member which has three photoelectric conversion layers made of amorphous Si. The photoelectric conversion layers of each of the photoelectric members are successively deposited on the lower electrode 113 by the plasma CVD process. A transparent conductive film made of ITO (Indium Tin Oxide) is formed on the upper surface of each of the photoelectric members by the RF spattering process. A layer insulation film 120 is deposited on the layer insulating film 118 formed on the substrate 101 and the transparent conductive film (ITO). After that, an aluminum film of which the upper electrode 114 is made is formed on the layer insulation film 120 to a thickness of 1 μm. The layer insulation film 120 has a through hole so that the upper electrode 114 (the aluminum film) is connected through the through hole to the transparent conductive film (ITO).

The shield antenna patterns 115 and 116 are respectively formed of the same material (Al) as the upper electrode 114 so as to extend in the longitudinal direction of the substrate 101 at the same time as the forming of the upper electrode 114. The shield antenna pattern 115 adjacent to the photoelectric conversion elements 102 is formed on the layer insulating film 120 on which the upper electrode 114 is stacked so as to be parallel to the upper electrode (a common electrode) 114 and to be, for example, separated from the upper electrode 114 by a distance of 20 μm. The other shield antenna pattern 116 adjacent to the TFT driving circuit 104 is formed on the layer insulating film 120 in the same manner as the shield antenna pattern 115 so as to be parallel to a clock signal line of the TFT driving circuit 104 and to be, for example, separated from the clock signal line by a distance of 20 μm. The width of each of the shield antenna patterns 115 and 116 is, for example, equal to 100 μm. When the upper electrode 114 and the shield antenna patterns 115 and 116 are formed, electrodes 122 of the TFTs are also formed.

Third, a film of amorphous Si:O:N is formed, as the protection layer 105, on both the photoelectric conversion elements 102 and the TFT driving circuit 104 by the plasma CVD process. Bonding pads for each of the electrodes and the shield antenna patterns 115 and 116 are formed on areas adjacent to ends of the substrate 101. After that, the thin glass plate 107 of 50 μm is adhered to the protection layer 105 by the adhesive 106.

Each of the layers of each of the photoelectric conversion elements 102 is shaped, in the same manner as the TFT driving circuit 104, by photolithography and dry etching. The width of an area where the photoelectric conversion elements 102 and the TFT driving circuit 104 are formed is, for example, equal to 2.76 mm. The number of the photoelectric conversion elements 102 arranged in a line is, for example, equal to 1728 bits, and the length of the area having the photoelectric conversion elements 102 and the TFT driving circuit 104 in the longitudinal direction of the substrate 101 corresponds to the width of the A4 size document sheet. That is, the length of the area having the photoelectric conversion elements 102, the TFT driving circuit 104 and the bonding pads in the longitudinal direction of the substrate 101 is, for example, equal to 240 mm.

Finally, the substrate 101 is cut to a size of a size of 3 mm mm×250 mm by the dicing saw.

The image sensor is exposed to external noises, such as a noise generated by the light source 111, and an electrostatic noise generated by the friction of the document sheet during the feeding thereof. The shield antenna patterns 115 and 116 are used for shielding the image sensor from the external noises. The shield antenna patterns 115 and 116 are respectively, for example, electrically connected to the ground. In such a case, the photoelectric conversion elements 102 and the TFT driving circuit 104 are sandwiched between the shield antenna patterns 115 and 116 which have a stabilized electrical potential of the ground so that the photoelectric conversion elements 102 and the TFT driving circuit 104 are shielded from the external noise. Thus, the output signal from each of the photoelectric conversion elements 102 is stabilized and the noise component in the output signal decreases so that the signal-to-noise ratio of the output signal increases.

In the case where the driving clock signal line of the TFT driving circuit 104 is arranged adjacent to the shield antenna pattern 116, a capacitance between the shield antenna pattern 116 and the driving clock signal line increases. Thus, surge noises which are generated at the lead edge of the clock signal and the tail edge thereof pass through the capacitance between the driving clock signal line and the shield antenna pattern 116 to the ground. As a result, no surge noises enter the shift register and the analogue switch in the TFT driving circuit 104 so that the signal-to-noise ratio of the output signal increases.

Figure 2:
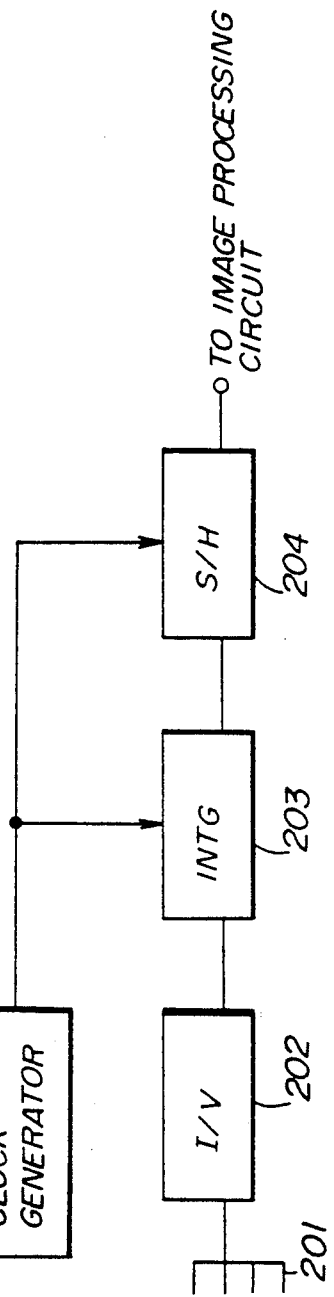
FIG. 2 is a block diagram showing a signal reading circuit which inputs an image signal from an image sensor and outputs a reading signal.

Each of the shield antenna patterns 115 and 116 can be connected to a signal reading circuit. The basic structure of the signal reading circuit is shown in FIG. 2. Referring to FIG. 2, the signal reading circuit has a current-to-voltage conversion circuit 202, an integrating circuit 203, a sample hold circuit 204 and a clock generator 205. A common electrode 201 (corresponding to the upper electrode 114 shown in FIG. 1) of the image sensor is connected to the current-to-voltage conversion circuit 202. The integrating circuit 203 integrates the voltage signal output from the current-to-voltage conversion circuit 202 in synchronism with a clock signal output from the clock generator 205. The voltage of the integral signal output from the integrating circuit 203 is sampled and held by the sample hold circuit 204 in synchronism with the clock signal, and the sample hold circuit 204 outputs an image signal corresponding to the sampled and held voltage in synchronism with the clock signal. The image signal is, for example, supplied to the image processing circuit provided at the next stage. The structures of the current-to-voltage circuit 202, the inverting circuit 203 and the sample hold circuit 204 are generally known.

Figure 3:
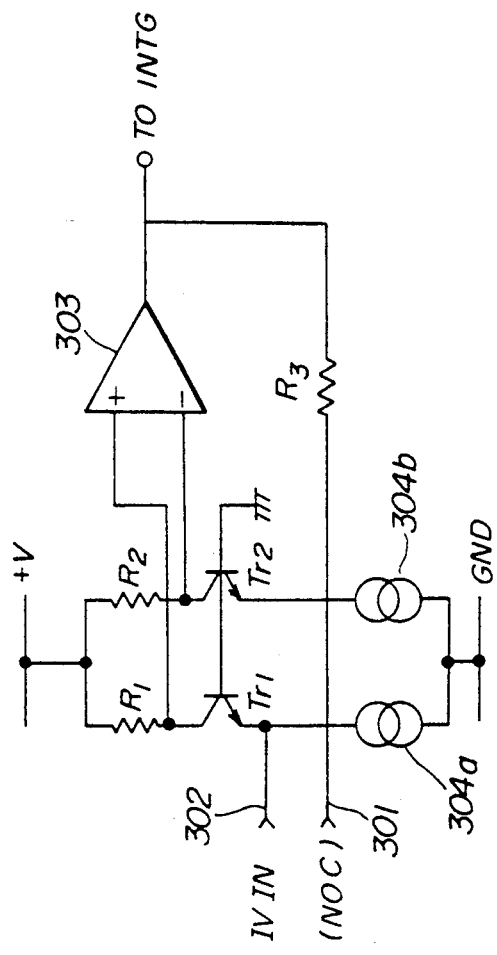
FIG. 3 is a circuit diagram showing a current-to-voltage conversion circuit shown in FIG. 2.

The current-to-voltage conversion circuit 202 has a structure shown in FIG. 3. Referring to FIG. 3, a first resistor R1, a first transistor Tr1 and a first constant current source 304a are serially connected between a power line (+V) and a ground line (GND). A second resistor R2, a second transistor Tr2 and a second constant current source 304b are also serially connected between the power line (+V) and the ground line (GND). A non-inverting terminal (+) of a differential amplifier 303 is connected to the collector of the first transistor Tr1. An inverting terminal (−) of the differential amplifier 303 is connected to the collector of the second transistor Tr2. A signal input terminal 302 is connected to the emitter of the first transistor Tr1 and an antenna terminal 301 is connected to the emitter of the second transistor Tr2. That is, the signal input terminal 302 is coupled through the first transistor Tr1 to the non-inverting terminal (+) of the differential amplifier 303 and the antenna terminal 301 is coupled through the second transistor Tr2 to the inverting terminal (−) of the differential amplifier 303. In addition, a resistor R3 is connected between the output terminal of the differential amplifier 303 and the emitter of the second transistor Tr2, the base of the transistor Tr1 and that of the transistor Tr2 are connected to the ground. In the current-to-voltage conversion circuit 202 shown in FIG. 3, the commom electrode 201 is connected to the signal input terminal 302, and both of the shield antenna patterns 115 and 116 are connected to the antenna terminal 301.

The differential amplifier 303 has a common mode rejection function. Thus, even if the external noise enters the common electrode 201 of the image sensor, the external noise is eliminated from the output signal of the differential amplifier 303.

A description will now be given of the principle of the elimination of the external noise with reference to FIGS. 4A and 4B.

Figure 4A:
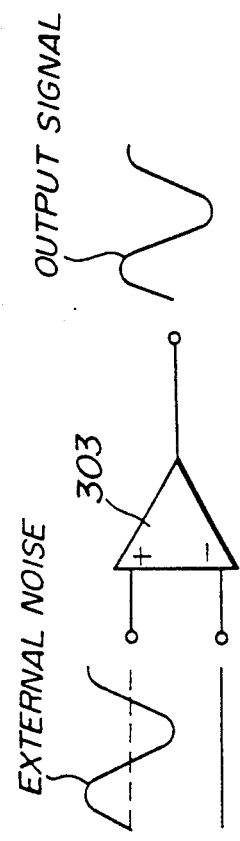
FIGS. 4A and 4B show a state in which the external noise is eliminated from a signal.
Figure 4B:
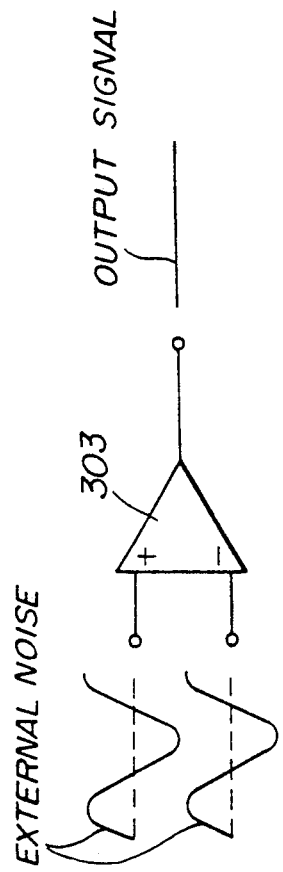

FIG. 4A shows a state where the shield antenna patterns 115 and 116 are not coupled to the inverting terminal (−) of the differential amplifier 303. In such a case, when the external noise is superposed on the input signal supplied to the non-inverting terminal (+) of the differential amplifier 303, the output signal from the differential amplifier 303 has a noise component corresponding to the external noise. Thus, the signal-to-noise ratio of the output signal decreases. On the other hand, FIG. 4B shows a state where the shield antenna patterns 115 and 116 respectively are coupled to the inverting terminal (−) of the differential amplifier 303. In such a case, a signal which has the same mode as the external noise superposed on the input signal is supplied from the shield antenna patterns 115 and 116 to the inverting terminal (−) of the differential amplifier 303. Thus, the differential amplifier 303 outputs a signal in which a noise corresponding to the external noise is eliminated so that the high signal-to-noise ratio of the output signal is obtained.

A description will now be given of a second embodiment of the present invention with reference to FIG. 5. In FIG. 5, which is a cross sectional view showing an image sensor, those parts which are the same as those shown in FIG. 1 are given the same reference numbers.

Referring to FIG. 5, the image sensor is supported by the base member 110 made of aluminum. The TFT circuit 104, the photoelectric conversion elements 102 and so on are formed in the same manner as the image sensor shown in FIG. 1. The shield antenna patterns 115 and 116 are formed on the layer insulating film 118 on which the lower electrode 113 is formed. The shield antenna patterns 115 and 116 extend along the sides of the image sensor in the longitudinal direction thereof. Both of the shield antenna patterns 115 and 116 are formed of the same material, which is Cr, and by the same process as the lower electrode 113. In this case, for example, the shield antenna pattern 115 formed adjacent to the photoelectric conversion elements 102 is connected to the antenna terminal 301 of the signal reading circuit shown in FIGS. 2 and 3, and the shield antenna pattern 116 formed adjacent to the TFT driving circuit 104 is connected to the ground.

A description will now be given of a third embodiment of the present invention with reference to FIG. 6. In FIG. 6, which is a cross sectional view showing an image sensor, those parts which are the same as those shown in FIG. 1 are given the same reference numbers.

Referring to FIG. 6, the image sensor is supported by the base member 110 made of aluminium. The TFT circuit 104, the photoelectric conversion elements 102 and so on are formed in the same manner as the image sensor shown in FIG. 1. Shield antenna patterns 115a and 116a are formed on the layer insulating film 118 on which the lower electrode 113 is formed. Other shield antenna patterns 115b and 116b are formed on the layer insulating film 120 on which the upper electrode 114 is formed. The shield antenna patterns 115a, 115b, 116a and 116b extend along the sides of the image sensor in the longitudinal direction thereof. Each of the shield antenna patterns 115a and 116a is formed of the same material, which is Cr, and by the same process as the lower electrode 113. Each of the shield antenna patterns 115b and 116b is formed of the same material, which is Al, and by the same process as the upper electrode 114. The shield antenna patterns 115a and 115b are electrically connected, through a through hole formed on the layer insulation film, to each other. The shield antenna patterns 116a and 116b are also electrically connected, through a through hole, to each other. In this case, for example, the shield antenna patterns 115a and 115b formed adjacent to the photoelectric conversion elements 102 are connected to the antenna terminal 301 of the signal reading circuit shown in FIGS. 2 and 3, and the shield antenna patterns 116a and 116b formed adjacent to the TFT driving circuit 104 are connected to the ground.

In the third embodiment described above, it is possible to form the shield antenna patterns 115a and 115b so they are insulated from each other. The shield antenna patterns 116a and 116b can also be formed in the same way.

In the first through third embodiments described above, the shield antenna patterns are formed along the sides of the image sensor in the longitudinal direction thereof so that both the photoelectric conversion elements 102 and the TFT driving circuit 104 are respectively sandwiched between the shield antenna patterns 115 and 116, as typically shown in FIG. 7. In addition, it is also possible to form the shield antenna patterns so that either the photoelectric conversion elements 102 or the TFT driving circuit 104 is sandwiched between the shield antenna patterns 115 and 116. The length of each of the shield antenna patterns in the longitudinal direction of the image sensor can be shorter than the length of the area having the photoelectric conversion elements 102 and the TFT driving circuit 104, in the longitudinal direction of the area. The shield antenna patterns are conductive members, and the material of each of the shield antenna patterns is not limited to that described in the above embodiments.

According to the above embodiments, the shield antenna patterns 115 and 116 are formed on at least either the layer insulating film 118 on which the lower electrode 113 is formed or the layer insulating film 120 on which the upper electrode 114 is formed so that it is possible to form the shield antenna patterns 115 and 116 at the same time as at least either the lower electrode 113 or the upper electrode 114. Thus, it is unnecessary to additionally provide a process for forming the shield antenna patterns 115 and 116, and thus it is possible to prevent the yield of the image sensor from decreasing. In addition, the shield antenna pattern 115 is provided adjacent to each of the photoelectric conversion elements so that the shield antenna pattern 115 can prevent stray light from being incident on each of the photoelectric conversion elements.

According to the image sensor of the present invention, it is possible to shield the image sensor from the external noise so that the signal-to-noise ratio is prevented from decreasing. In addition, according to the optical reading unit of the present invention, it is possible to eliminate the noise component from the signal output from each of the photoelectric conversion elements so that the signal-to-noise ratio is prevented from decreasing.

The present invention is not limited to the aforementioned embodiments, and variations and modifications may be made without departing from the scope of the claimed invention.

What is claimed is:

1. An image sensor comprising:
   a substrate made of an insulating and transparent material;
   a plurality of photoelectric conversion elements which are provided on said substrate and arranged in a predetermined direction, each of said photoelectric conversion elements having a photoelectric member, a first electrode and a second electrode, said photoelectric member being sandwiched between said first electrode and said second electrode;
   a driving circuit, which is provided on said substrate and extends in a direction parallel to the direction in which said photoelectric conversion elements are arranged, for driving said photoelectric conversion elements; and
   a conductive member, which is adjacent to at least one of said photoelectric conversion elements and said driving circuit, for receiving an external noise, said conductive member being separated from a signal line through which optical signals output from said photoelectric conversion elements are transmitted;
   wherein said conductive member is formed at an end portion of said image sensor so as to extend in a direction parallel to the direction in which said photoelectric conversion elements are arranged;
   wherein said conductive member has a first conductive film adjacent to said photoelectric conversion elements and a second conductive film adjacent to said driving circuit; and
   wherein said first conductive film is formed at a first end of said image sensor so as to extend in a direction parallel to the direction in which said photoelectric conversion elements are arranged, and said second conductive film is formed at a second end portion of said image sensor so as to extend in the longitudinal direction of said image sensor, so that said photoelectric conversion elements and said driving circuit are positioned between said first conductive film and said second conductive film.

2. An image sensor as claimed in claim 1, wherein each of said photoelectric conversion elements has a first insulating layer on which said first electrode is formed, and said conductive member is formed on said first insulating layer.

3. An image sensor as claimed in claim 2, wherein said conductive member is made of the same material as said first electrode of each of said photoelectric conversion elements.

4. An image sensor as claimed in claim 2, wherein each of said photoelectric conversion elements has a second insulating layer on which said second electrode is formed, and said conductive member is formed on said second insulating layer.

5. An image sensor as claimed in claim 4, wherein said conductive member is made of the same material as said second electrode of each of said photoelectric conversion elements.

6. An image sensor as claimed in claim 1, wherein each of said photoelectric conversion elements has a first insulating layer on which said first electrode is formed and a second insulating layer on which said second electrode is formed, and wherein said conductive member has a first member formed on said first insulating layer and a second member formed on said second insulating layer.

7. An image sensor as claimed in claim 6, wherein said first member is made of the same material as said first electrode of each of said photoelectric conversion elements and said second member is made of the same material as said second electrode of each of said photoelectric conversion elements.

8. An image sensor as claimed in claim 6, wherein said first member is electrically connected to said second member.

9. An image sensor as claimed in claim 1, wherein said second conductive film extends in a direction parallel to the direction in which said photoconductive elements are arranged.

10. An image sensor as claimed in claim 1, wherein each of said photoelectric conversion elements has a first insulating layer on which said first electrode is formed, and said first conductive film is formed on said first insulating layer.

11. An image sensor as claimed in claim 10, wherein said first conductive film is made of the same material as said first electrode of each of said photoelectric conversion elements.

12. An image sensor as claimed in claim 10, wherein said second conductive film is formed on said first insulating layer.

13. An image sensor as claimed in claim 12, wherein said first conductive film and said second conductive film are respectively made of the same material as said first electrode of each of said photoelectric conversion elements.

14. An image sensor as claimed in claim 1, wherein each of said photoelectric conversion elements has a second insulating layer on which said second electrode is formed, and said first conductive film is formed on said second insulating layer.

15. An image sensor as claimed in claim 14, wherein said first conductive film is made of the same material as said second electrode of each of said photoelectric conversion elements.

16. An image sensor as claimed in claim 14, wherein said second conductive film is formed on said second insulating layer.

17. An image sensor as claimed in claim 16, wherein said first conductive film and said second conductive film are respectively made of the same material as said second electrode of each of said photoelectric conversion elements.

18. An image sensor as claimed in claim 1, wherein each of said photoelectric conversion elements has a first insulating layer on which said first electrode is formed and a second insulating layer on which said second electrode is formed, and wherein said first conductive film has a first film formed on said first insulating layer and a second film formed on said second insulating layer.

19. An image sensor as claimed in claim 18, wherein said first film of said first conductive film is electrically connected to said second film thereof.

20. An image sensor as claimed in claim 18, wherein said second conductive film has a first film formed on said first insulating layer and a second film formed on said second insulating layer.

21. An image sensor as claimed in claim 20, wherein said first film of said first conductive film is electrically connected to said second film thereof, and said first film of said second conductive film is electrically connected to said second film of said second conductive film.

22. An optical reading apparatus comprising:
an image sensor having;
a substrate made of an insulating and transparent material,
a plurality of photoelectric conversion elements which are provided on said substrate and arranged in a predetermined direction of said substrate, each of said photoelectric conversion elements having a photoelectric member, a first electrode and a second electrode, said photoelectric member being sandwiched between said first electrode and said second electrode,
a driving circuit, which is provided on said substrate and extends parallel to said photoelectric conversion elements, for driving said photoelectric conversion elements, and
a conductive member, adjacent to at least one of said photoelectric conversion elements and said driving circuit, for receiving an external noise,
noise eliminating means, coupled to each of said photoelectric conversion elements and said conductive member of said image sensor, for inputting a first signal from each of said photoelectric conversion elements and a second signal from said conductive member, and for outputting a signal which is obtained by eliminating a noise component corresponding to said second signal from said first signal; and
signal generating means, coupled to said noise eliminating means, for generating an image signal on the basis of said signal output from said noise eliminating means;
wherein said conductive member of said image sensor is formed at an end portion of said image sensor so as to extend in a direction parallel to the direction in which said photoelectric conversion elements are arranged;
wherein said conductive member of said image sensor has a first conductive film adjacent to said photoelectric conversion elements and a second conductive film adjacent to said driving circuit; and
wherein said first conductive film is formed at a first end portion of said image sensor so as to extend in a direction parallel to the direction in which said photoelectric conversion elements are arranged, and said second conductive film is formed at a second end portion of said image sensor so as to extend in the longitudinal direction of said image sensor, so that said photoelectric conversion elements and said driving circuit are positioned between said first conductive film and said second conductive film.

23. An optical reading apparatus as claimed in claim 22, wherein said noise eliminating means has differential signal generating means for generating a signal corresponding to a difference between said first signal from each of said photoelectric conversion elements and said second signal from said conductive member of said image sensor.

24. An optical reading apparatus as claimed in claim 23, wherein said differential signal generating means has a differential amplifier to which said first signal from each of said photoelectric conversion elements and said second signal from said conductive member of said image sensor are input.

* * * * *